United States Patent
Shibata

(10) Patent No.: US 7,425,881 B2
(45) Date of Patent: Sep. 16, 2008

(54) SURFACE ACOUSTIC WAVE DEVICE AND METHOD THAT PREVENTS RESTORATION OF A PYROELECTRIC EFFECT

(75) Inventor: Osamu Shibata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 194 days.

(21) Appl. No.: 10/548,127

(22) PCT Filed: Feb. 16, 2005

(86) PCT No.: PCT/JP2005/002294

§ 371 (c)(1),
(2), (4) Date: Sep. 2, 2005

(87) PCT Pub. No.: WO2005/091500

PCT Pub. Date: Sep. 29, 2005

(65) Prior Publication Data

US 2006/0170521 A1    Aug. 3, 2006

(30) Foreign Application Priority Data

Mar. 18, 2004   (JP) .............................. 2004-078266

(51) Int. Cl.
*H03H 9/15*   (2006.01)
*H03H 3/02*   (2006.01)
*H03H 9/54*   (2006.01)

(52) U.S. Cl. .................... 333/193; 310/313 A; 310/344; 29/25.35

(58) Field of Classification Search ................. 333/193
See application file for complete search history.

(56) References Cited

U.S. PATENT DOCUMENTS

| | | | | |
|---|---|---|---|---|
| 4,213,104 A | * | 7/1980 | Cullen et al. ................ | 333/150 |
| 5,281,883 A | * | 1/1994 | Ikata et al. ................ | 310/313 R |
| 6,319,430 B1 | * | 11/2001 | Bordui et al. ............... | 252/584 |
| 6,349,870 B1 | * | 2/2002 | Kimura et al. ........... | 228/110.1 |
| 6,666,371 B2 | * | 12/2003 | Nakazawa et al. .......... | 228/212 |

(Continued)

FOREIGN PATENT DOCUMENTS

EP    0 893 515 A1    1/1999

(Continued)

OTHER PUBLICATIONS

Official Communication issued in corresponding Korean Patent Application No. 10-2005-7016764, dated Sep. 27, 2006.

(Continued)

*Primary Examiner*—Barbara Summons
(74) *Attorney, Agent, or Firm*—Keating & Bennett, LLP

(57) ABSTRACT

A surface acoustic wave device includes a piezoelectric substrate that does not restore the pyroelectric effect, and a method for manufacturing the same. A surface acoustic wave element housed in a package includes a piezoelectric substrate having a specific resistance in the range of about $1.0 \times 10^7$ Ω·cm to about $1.0 \times 10^{13}$ Ω·cm. Pads are electrically connected to an external electrode with a solder. The space between the package and a cap of the package is sealed with a sealing material. At least one of the solder and the sealing material has a melting point of about 300° C. or less.

15 Claims, 3 Drawing Sheets

U.S. PATENT DOCUMENTS

| | | | |
|---|---|---|---|
| 6,800,946 B2 * | 10/2004 | Chason et al. | 257/778 |
| 7,116,187 B2 * | 10/2006 | Inoue | 333/133 |
| 7,153,487 B2 * | 12/2006 | Jundt et al. | 423/594.8 |
| 7,205,700 B2 * | 4/2007 | Yamato | 310/313 B |
| 2004/0095038 A1 | 5/2004 | Takase et al. | |
| 2004/0245891 A1 * | 12/2004 | Kawachi et al. | 310/313 R |
| 2004/0255842 A1 * | 12/2004 | Kajigaya et al. | 117/2 |
| 2005/0001696 A1 * | 1/2005 | Otsuka et al. | 333/133 |
| 2005/0066879 A1 * | 3/2005 | Shiono | 117/2 |
| 2005/0200234 A1 * | 9/2005 | Sobu et al. | 310/313 R |
| 2005/0201926 A1 * | 9/2005 | Miles et al. | 423/594.8 |
| 2006/0131991 A1 * | 6/2006 | Kawakami | 310/311 |

FOREIGN PATENT DOCUMENTS

| | | | |
|---|---|---|---|
| JP | 7-154190 | * | 6/1995 |
| JP | 08-056133 | | 2/1996 |
| JP | 10-107573 | | 4/1998 |
| JP | 10-163798 | | 6/1998 |
| JP | 11-17485 | * | 1/1999 |
| JP | 11-092147 | | 4/1999 |
| JP | 11-136081 | | 5/1999 |
| JP | 2000-183221 | | 6/2000 |
| JP | 2000-357937 | | 12/2000 |
| JP | 2001-168676 | | 6/2001 |
| JP | 2002-016468 | | 1/2002 |
| JP | 2002-026687 | | 1/2002 |
| JP | 2002-100951 | | 4/2002 |
| JP | 2002-246868 | | 8/2002 |
| JP | 2003-283282 | | 10/2003 |
| JP | 2004-152870 | * | 5/2004 |
| JP | 2005-20423 | * | 1/2005 |
| JP | 2005-119907 | | 5/2005 |

OTHER PUBLICATIONS

Official communication issued in counterpart Chinese Application No. 200580000067.4, issued on Jun. 20, 2008.

* cited by examiner

SURFACE ACOUSTIC WAVE DEVICE AND METHOD THAT PREVENTS RESTORATION OF A PYROELECTRIC EFFECT

BACKGROUND OF THE INVENTION

1. Field of the Invention

The present invention relates to a surface acoustic wave device.

2. Description of the Related Art

Surface acoustic wave filters (SAW filters) used for RF's (radio frequencies) are generally required to work on a wide frequency band and to have a low loss. Accordingly, lithium tantalate ($LiTaO_3$) or lithium niobate ($LiNbO_3$), both of which have high electromechanical coupling coefficients, is used for the piezoelectric substrate. Since such a piezoelectric substrate has a pyroelectric effect, if pyroelectric charges generated by temperature changes are built up on the excitation electrodes, electrostatic discharge occurs between the electrodes and thus breaks them. In order to prevent such pyroelectric breakage of the electrodes, a manufacturing process uses a method in which electrodes are electrically connected to each other with a conductor so that they have the same potential. The conductor is to be removed afterwards. The manufacturing process is thus complicated. In addition, since the electrodes are electrically separated from each other in a final step, the pyroelectric breakage of the electrodes cannot be prevented afterwards. Furthermore, pyroelectric charges may be generated by heat in the step of mounting a surface acoustic wave filter on the circuit board of, for example, a portable device, and consequently may disadvantageously cause other electronic components to break.

Patent Document Japanese Unexamined Patent Application Publication No. 11-92147 disclosed that the buildup of surface charges on lithium tantalate or lithium niobate is reduced by controlling the crystal structure.

Use of piezoelectric substrates made of those materials that do not build up pyroelectric charges can prevent the pyroelectric breakage of electrodes, and makes the pyroelectric effect insignificant. It is therefore believed that special steps can be eliminated which are performed as measures against pyroelectric breakage, for example, the step of electrically connecting the electrodes.

However, even the piezoelectric substrates in which the pyroelectric effect should be insignificant can restore the pyroelectric effect in practice, and consequently pyroelectric charges cause problems in some cases.

SUMMARY OF THE INVENTION

In order to overcome the problems described above, preferred embodiments of the present invention provide a surface acoustic wave device including a piezoelectric substrate that does not restore the pyroelectric effect, and a method for manufacturing the same. Preferred embodiments of the present invention also provide a surface acoustic wave device having the following structure.

A surface acoustic wave device according to a preferred embodiment preferably includes a surface acoustic wave element having on a piezoelectric substrate at least an excitation electrode and a pad connected to the excitation electrode. A package having an external electrode exposed to the outside houses the surface acoustic wave element with the external electrode electrically connected to the pad. A cap covers the surface acoustic wave element with a sealing material sealing the space between the package and the cap. The piezoelectric substrate has a specific resistance in the range of about $1.0\times 10^7$ to about $1.0\times 10^{13}$ $\Omega\cdot cm$, and the sealing material has a melting point of about 300° C. or less.

In the above-described structure, if the specific resistance of the piezoelectric substrate is about $1.0\times 10^{13}$ $\Omega\cdot cm$ or less, the time constant is reduced to about $1/100$ or less of the time constant of known piezoelectric substrates having specific resistances of about $1.0\times 10^{15}$ $\Omega\cdot cm$, and accordingly, the pyroelectric charges disappear within a time of about $1/100$ compared to the known piezoelectric substrates. For example, in a reflowing step which may be negatively affected by pyroelectric charges, even if pyroelectric charges are generated during a temperature increase they are not built up because the temperature of the reflow oven generally reaches a maximum temperature over a period of several hours. Thus, the pyroelectric effect of the piezoelectric substrate can become insignificant.

On the other hand, a piezoelectric substrate having a specific resistance of about $1.0\times 10^7$ $\Omega\cdot cm$ or more has a parasitic resistance of about $1.0\times 10^7$ $\Omega$ or more, which is, for example, at least five digits higher than the impedance of an RF surface acoustic wave filter, specifically, about 50 $\Omega$ to several hundred $\Omega$. Such a specific resistance of the piezoelectric substrate does not affect the insertion loss at all. Hence, the electrical characteristics of the surface acoustic wave device are not degraded.

However, it has been discovered that even the piezoelectric substrate having a specific resistance in the range of about $1.0\times 10^7$ $\Omega\cdot cm$ to about $1.0\times 10^{13}$ $\Omega\cdot cm$, in which the pyroelectric effect should be insignificant, the pyroelectric effect at high temperatures is restored. When the temperature increases beyond about 350° C., the piezoelectric substrate rapidly restores the pyroelectric effect. If a conventionally used solder or sealing material, which has a melting point of about 300° C. or more, is used, the temperature of the piezoelectric substrate increases so as to restore the pyroelectric effect, and thus a problem occurs during the manufacturing process.

As described above, by reducing the melting point of the sealing material to about 300° C. or less so that the temperature of the piezoelectric substrate during the manufacturing process is lower than the temperature (about 350° C.) at which the pyroelectric effect is rapidly restored, the piezoelectric substrate can be prevented from restoring the pyroelectric effect.

Preferably, the region where the external electrode is electrically connected to the pad contains a solder having a melting point of about 300° C. or less.

Use of a solder having a melting point of about 300° C. or less allows the temperature of the piezoelectric substrate during the manufacturing process to be lower than the temperature (about 350° C.) at which the pyroelectric effect is rapidly restored, thus preventing the piezoelectric substrate from restoring the pyroelectric effect.

Preferably, at least one of the sealing material and the solder is made of AgSn or an AuSn alloy, for example.

AgSn and AuSn alloys have a melting point of about 300° C. or less. Also, these alloys can be prepared so as not to contain Pb, the use of which is being increasingly restricted in view of environmental protection.

Preferably, the piezoelectric substrate is made of $LiTaO_3$ or $LiNbO_3$, for example.

$LiTaO_3$ or $LiNbO_3$ can have a specific resistance in the range of about $1.0\times 10^7$ $\Omega\cdot cm$ to about $1.0\times 10^{13}$ $\Omega\cdot cm$ by, for example, oxygen reduction while the piezoelectric characteristics are maintained.

In order to solve the above-described problems, a preferred embodiment of the present invention also provides a method for manufacturing a surface acoustic wave device.

The method of manufacturing produces a surface acoustic wave device including a surface acoustic wave element having on a piezoelectric substrate at least an excitation electrode and a pad connected to the excitation electrode, and a package housing the surface acoustic wave element and having an external electrode exposed to the outside of the package. The method includes the steps of electrically connecting the external electrode to the pad and sealing the package with a cap. The piezoelectric substrate has a specific resistance in the range of about $1.0 \times 10^7$ Ω·cm to about $1.0 \times 10^{13}$ Ω·cm. The step of electrically connecting the external electrode to the pad or the step of sealing the package with the cap can be performed in an atmosphere of an inert gas, for example.

It has been found that the reason why piezoelectric substrates having specific resistances in the range of about $1.0 \times 10^7$ Ω·cm to about $1.0 \times 10^{13}$ Ω·cm, in which the pyroelectric effect should be insignificant, restores the pyroelectric effect is that oxygen in air and heating cause the piezoelectric substrate to reoxidize.

By performing the connection of the pad of the surface acoustic wave element and the sealing of the package in an atmosphere of an inert gas, as described above, the piezoelectric substrate is prevented from restoring the pyroelectric effect even if the temperature of the piezoelectric substrate increases. In view of this, the solder used for the electrical connection between the pad and the external electrode and the sealing material for sealing the space between the package and the cap do not need to have low melting points. For example, a generally used solder having a melting point of more than about 300° C. can be used as the solder or the sealing material.

Since the surface acoustic wave element housed in the surface acoustic wave device is held in an inert gas atmosphere, the surface acoustic wave element does not restore the pyroelectric effect even if the temperature of the surface acoustic wave device is increased in a reflowing step in a process for mounting the device on a printed board of, for example, a portable device. Thus, the surface acoustic wave device does not need strict temperature control when it is mounted, and accordingly the mounting can be readily performed.

Preferably, the inert gas is $N_2$.

$N_2$ leads to a lower cost and is more easily available than other inert gases.

Preferably, the pad and the external electrode are connected by ultrasonic vibration and Au bump bonding with heating at a temperature of about 300° C. or less.

Since, in the step of electrically connecting the external electrode to the pad, the temperature of the piezoelectric substrate can be reduced to a temperature lower than or equal to the temperature (about 350° C.) at which the pyroelectric effect is rapidly restored, the piezoelectric substrate can be prevented from restoring the pyroelectric effect even in a non-inert gas atmosphere.

The surface acoustic wave device and the method for manufacturing the same according to preferred embodiments of the present invention can prevent the piezoelectric substrate from restoring the pyroelectric effect.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to FIGS. 1 to 4.

Figure 1:
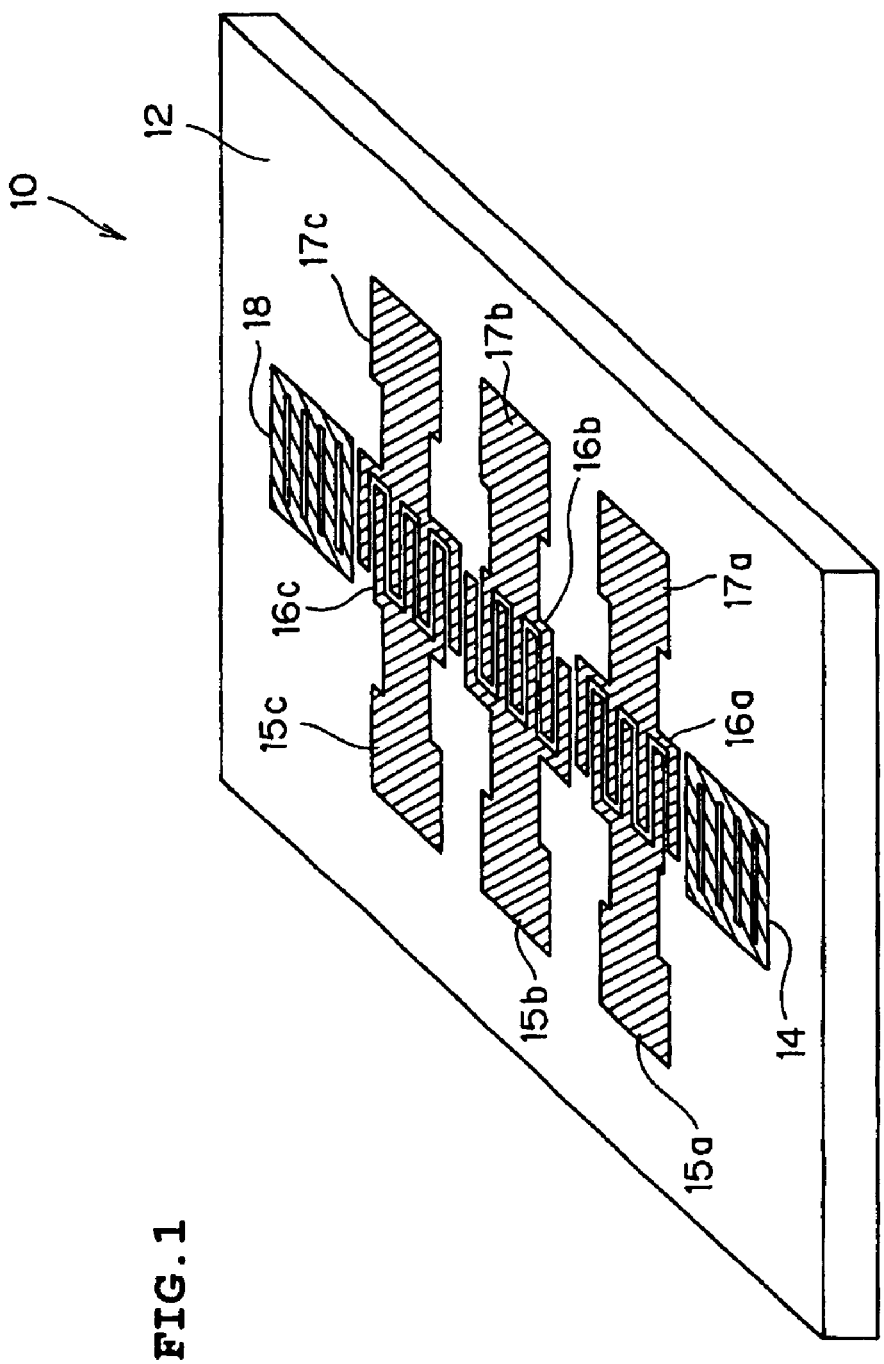
FIG. 1 is a schematic external view of a surface acoustic wave element according to a preferred embodiment of the present invention.

As shown in the external view of FIG. 1, a surface acoustic wave element 10 includes comb-like (Japanese bamboo screen-like) excitation electrodes 16a, 16b, and 16c; reflectors 14 and 18; and bonding pads 15a, 15b, and 15c and 17a, 17b, and 17c connected to their respective excitation electrodes 16a, 16b, and 16c on one surface of a piezoelectric substrate 12.

The piezoelectric substrate 12 is preferably made of lithium niobate ($LiNbO_3$) or lithium tantalate ($LiTaO_3$) that has been subjected to oxygen reduction. This reduction can reduce the specific resistance of the piezoelectric substrate 12 to about $1.0 \times 10^{13}$ Ω·cm or less to prevent the buildup of pyroelectric charges while the piezoelectric substrate maintains the piezoelectric characteristics.

The specific resistance of the piezoelectric substrate 12 is preferably in the range of about $1.0 \times 10^7$ Ω·cm to about $1.0 \times 10^{13}$ Ω·cm A piezoelectric substrate 12 having a specific resistance of about $1.0 \times 10^{13}$ Ω·cm or less has a time constant of about ¹⁄₁₀₀ or less than that of known piezoelectric substrates having specific resistances of about $1.0 \times 10^{15}$ Ω·cm. Accordingly pyroelectric charges disappear within a time of about ¹⁄₁₀₀ compared to that in the known piezoelectric substrates. For example, in a reflow soldering step, which may be negatively affected by pyroelectric charges, pyroelectric charges are not built up even if they are generated during a temperature increase because the temperature of the reflow oven generally reaches a maximum temperature over a period of several hours. Thus, the pyroelectric effect of the piezoelectric substrate can become insignificant.

On the other hand, a piezoelectric substrate 12 having a specific resistance of about $1.0 \times 10^7$ Ω·cm or more has a parasitic resistance of about $1.0 \times 10^7$ Ω or more, which is, for example, at least five digits higher than the impedance of an RF surface acoustic wave filter, about 50 Ω to several hundred Ω. Such a specific resistance of the piezoelectric substrate does not affect the insertion loss at all. Hence, the electrical characteristics of the surface acoustic wave device are not degraded.

The specific resistance of the piezoelectric substrate 12 refers to a value calculated from the result obtained by measuring the resistance between electrode pads provided for the measurement on the front and rear surfaces of the piezoelectric substrate 12 (JIS C 2141). In other words, the specific resistance is that in the thickness direction of the piezoelectric substrate 12. The same applies in the following description.

Figure 2:
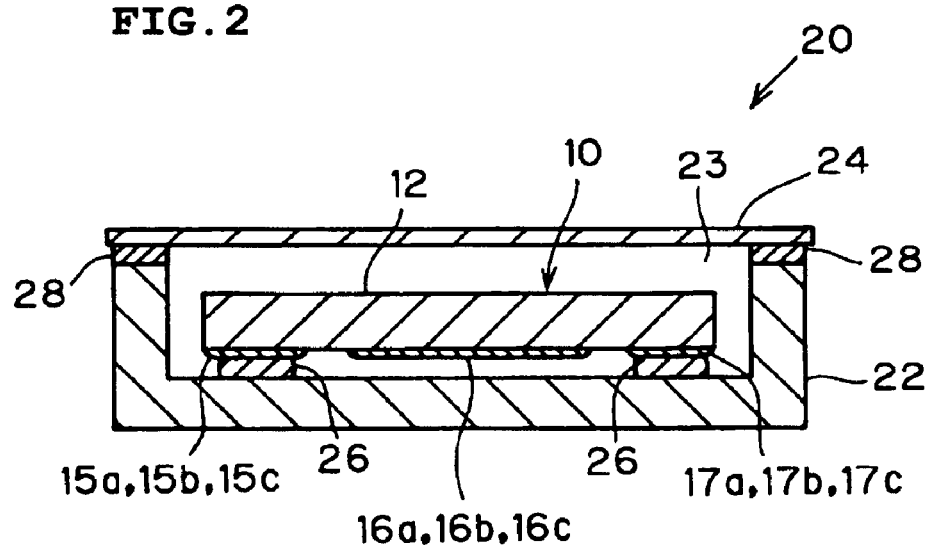
FIG. 2 is a cross-sectional view showing the structure of a surface acoustic wave device according to a preferred embodiment of the present invention.

The surface acoustic wave element 10 is housed in a empty space 23 of a package 22 with an external electrode (not shown) exposed to the outside and is flip-chip bonded, as shown in FIG. 2. Specifically, the position of the surface acoustic wave element 10 is fitted such that the bonding pads 15a, 15b, and 15c and 17a, 17b, and 17c directly oppose their corresponding bumps 26 provided in the package 22, and then the surface acoustic wave element 10 is bonded by applying heat and pressure. The bumps 26 are electrically connected to the external electrode (not shown). Hence, the bonding pads 15a, 15b, and 15c and 17a, 17b, and 17c are electrically connected to the external electrode (not shown) via the bumps 26.

The bumps 26 are preferably made of a solder capable of establishing connection at about 300° C. or less. For example, it may be made of AgSn or an AuSn alloy. Also, by applying supersonic vibration and weight, even Au bumps can establish connections at about 300° C. or less.

After the flip chip bonding, a cap 24 is put on the package 22 to cover the surface acoustic wave element 10 and the space between the package 22 and the cap 24 is sealed with a sealing material 28. For example, the sealing material 28 is put on the package 22 or the cap 24 in advance, and is then heated to melt with the cap 24 put on the package 22, thereby sealing the space between the package 22 and the cap 24.

The sealing material 28 is made of a substance having a melting point of about 300° C. or less. For example, it may be made of AgSn or an AuSn alloy, which has a lower melting point than generally used solder.

For example, the bump 26 and the sealing material 28 are made of an AgSn alloy containing about 96.5 percent by weight of Sn and about 3.5 percent by weight of Ag. This AgSn alloy has a melting point of about 221° C. and is eutectic. Any other AgSn or AuSn alloy having a different composition may be used as long as the melting point is about 300° C. or less.

Conventionally used solders mainly containing Pb may be used as long as it has a melting point of about 300° C. or less. However, Pb-free solders are preferable in view of environmental impact.

By reducing the melting points of the bumps 26 and the sealing material 28, the temperatures for flip-chip bonding the surface acoustic wave element 10 and for sealing the space between the cap 24 and the package 22 with the sealing material 28 can be reduced to about 300° C. or less. Since the temperature increase of the piezoelectric substrate 12 can be thus minimized, the piezoelectric substrate 12 can be prevented from restoring the pyroelectric effect. This will be described in detail later.

Figure 3:
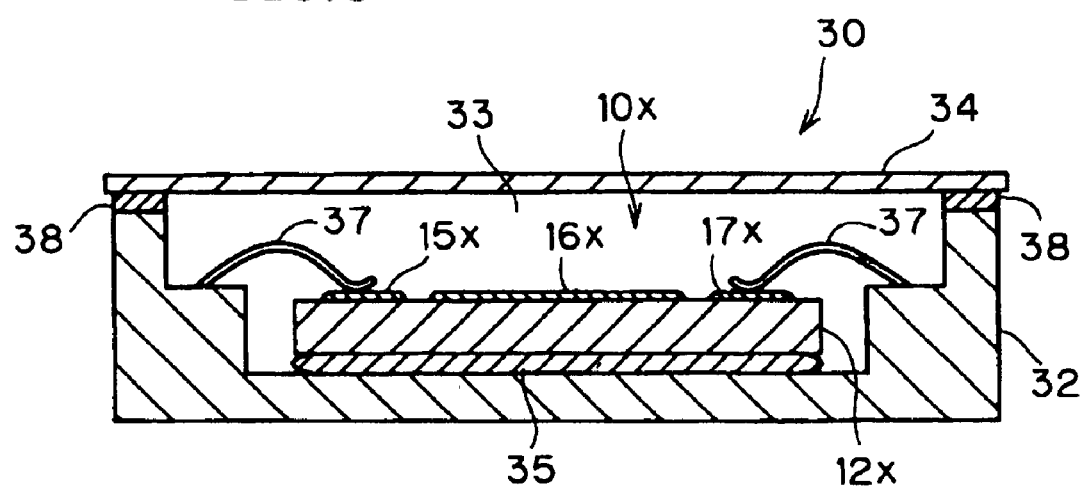
FIG. 3 is a cross-sectional view showing the structure of a surface acoustic wave device according to one modification of preferred embodiments of the present invention.

Turning now to FIG. 3, a modification will be described in which the surface acoustic wave element is joined by wire bonding.

As shown in FIG. 3, a surface acoustic wave element 10x, which has substantially the same structure as the foregoing surface acoustic wave element 10, includes comb-like (Japanese bamboo screen-like) excitation electrodes 16x and pads 15x and 17x connected to the excitation electrodes 16x, on one surface of a piezoelectric substrate 12x. The piezoelectric substrate 12x has a specific resistance in the range of about $1.0 \times 10^7$ Ω·cm to about $1.0 \times 10^{13}$ Ω·cm, and thus the buildup of pyroelectric charges can be prevented.

The surface acoustic wave element 10x is fixed in the empty space 33 of a package 32 with a chip fixing member 35 and then wire-bonded. Specifically, pads 15x and 17x of the surface acoustic wave element 10x are connected to terminals (not shown) of the package 32 with bonding wires 37. The ends of the bonding wires 37 are pressed and subjected to ultrasonic vibration or heating or both, thereby being bonded.

After the surface acoustic wave element 10x is housed in the package 32 and wire-bonded, the package 32 is covered with a cap 34 and sealed with a sealing material 38. The sealing material 38 has a melting point of about 300° C. or less. For example, AgSn or an AuSn alloy is preferably used.

Use of the bumps 26 and sealing materials 28 and 38 having a melting point of about 300° C. or less can prevent the temperature of the piezoelectric substrate 12 or 12x from increasing, thus preventing the piezoelectric substrate from restoring the pyroelectric effect. This will now be described with reference to FIG. 4.

Figure 4:
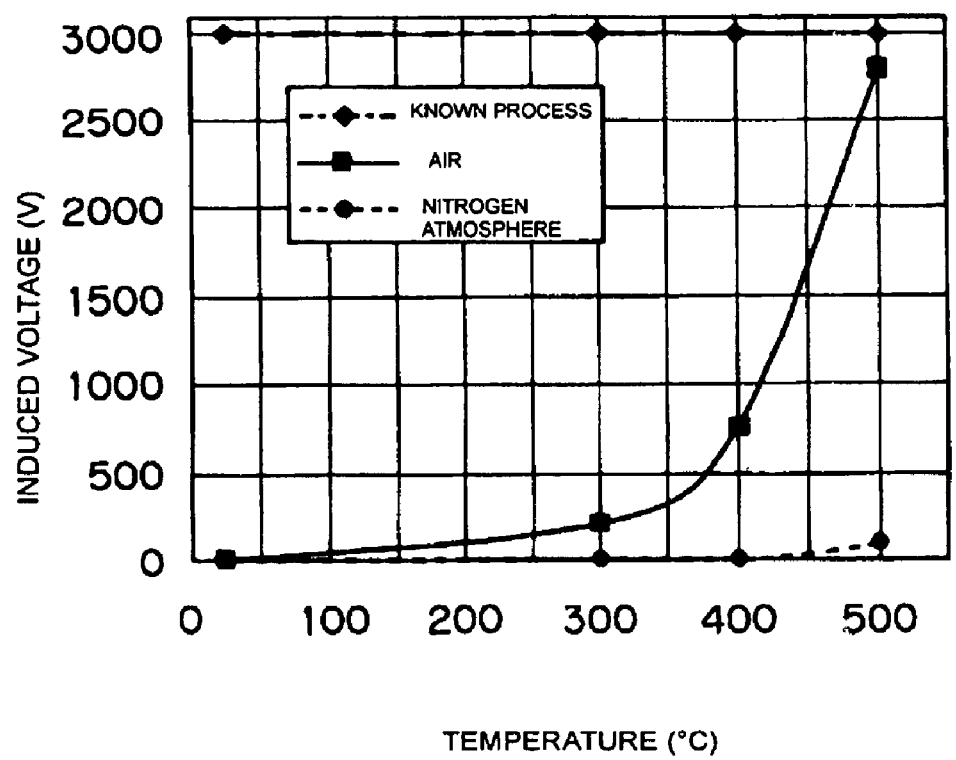
FIG. 4 is a plot showing the relationships between the temperature of a piezoelectric substrate and the induced voltage.

FIG. 4 shows the measurement results of induced voltages at the surfaces of the wafers of piezoelectric substrates after annealing for an hour. The horizontal axis represents the annealing temperature and the vertical axis represents the induced voltage. In FIG. 4, "KNOWN PROCESS" refers to the case where a conventional non-reduced lithium tantalate ($LiTaO_3$) piezoelectric substrate was heat-treated in air, "AIR" refers to the case where a reduced lithium tantalate ($LiTaO_3$) piezoelectric substrate used in the present preferred embodiment was heat-treated in air, and "NITROGEN ATMOSPHERE" refers to the case where the reduced lithium tantalate ($LiTaO_3$) piezoelectric substrate used in the preferred embodiment was heat-treated in a nitrogen ($N_2$) atmosphere. The voltage induced at the wafer surface results from the pyroelectric effect of the piezoelectric substrate. As the induced voltage increases, pyroelectric breakage more easily occurs in the electrode.

FIG. 4 shows that even the reduced piezoelectric substrate restores the pyroelectric effect if it is heat-treated in air. Specifically, when the annealing temperature reaches about 350° C. or more, the pyroelectric effect is rapidly restored and the voltage reaches the same level at about 500° C. as the voltage of the piezoelectric substrate originally having the pyroelectric effect. Thus, the pyroelectric effect is completely restored. This is because oxygen in the air and heat promote the reoxidation of the piezoelectric substrate. In contrast, the piezoelectric substrate annealed in a nitrogen atmosphere hardly restores the pyroelectric effect.

Processes for manufacturing surface acoustic wave devices include steps that require heating. If the reduced piezoelectric substrate is used, the heating is performed at a low temperature with oxygen maintained at a low concentration thereby preventing the pyroelectric effect from being restored.

The sealing is generally performed by welding a metal cap, or by soldering. Welding locally increases temperature to about 1,000° C., and accordingly the internal temperature of the product is also increased. On the other hand, soldering allows the sealing at a temperature about 350° C., which is the melting point of conventional solder. Soldering is more effective in preventing the piezoelectric substrate from reoxidizing.

Even in soldering, however, if the temperature increases beyond 350° C., the pyroelectric effect of the piezoelectric substrate is rapidly restored. Use of a low-melting point AgSn or AuSn alloy as the sealing material can reduce the sealing temperature to about 300° C. or less, thus effectively preventing the piezoelectric substrate from restoring the pyroelectric effect.

For bonding the surface acoustic wave element by flip chip bonding, a solder having a high melting point is conventionally used as the solder for the bumps and the sealing material for sealing the space between the package and the cap. This is because when the resulting surface acoustic wave device is mounted on a printed board, the melting point of the solder for the bumps and the sealing material need to be higher than that of the solder used for mounting the device on the printed board from the viewpoint of preventing the remelting of the bump solder and the sealing material.

In the known processes, high-temperature solders mainly containing Pb are used and the peak temperature of the sealing reflow oven is set at about 330° C. to about 360° C. For example, a conventionally used high-temperature solder contains 82 percent by weight of Pb, 12 percent by weight of Sn, 1 percent by weight of Ag, and 5 percent by weight of Sb. This solder has a solidus of 238° C. and a liquidus of 265° C. The solder is solid at temperatures lower than or equal to the solidus, and it is in a mixed state of solid and liquid at temperatures between the solidus and the liquidus.

Since the present preferred embodiment uses a solder having a lower melting point than conventional solders as the bump solder and sealing material, the mounting on a printed board must be performed with a solder having a melting point lower than that of the bump solder and sealing material, or with a conductive paint.

A surface acoustic wave device according to a second preferred embodiment will now be described.

The surface acoustic wave device of the second preferred embodiment has substantially the same structure as in the first preferred embodiment, except for the following.

In the surface acoustic wave device of the second preferred embodiment, the surface acoustic wave element is housed in the package by flip chip bonding or wire bonding in a nitrogen atmosphere, and then the package is sealed. Consequently, the package of the surface acoustic wave device is filled with nitrogen, so that the surface acoustic wave element is held and maintained in the nitrogen atmosphere.

As clearly shown in FIG. 4, any nitrogen atmosphere prevents the piezoelectric substrate from restoring the pyroelectric effect even if the heating temperature increases. Hence, the melting point of the bump solder and sealing material is not necessarily limited to about 300° C. or less.

In a process in which the substrate is exposed to high temperature for several hours, a nitrogen atmosphere is extremely effective in preventing the piezoelectric substrate from restoring the pyroelectric effect. In the mounting of the surface acoustic wave device of the present preferred embodiment on a printed board of, for example, a portable device, the piezoelectric substrate does not restore the pyroelectric effect even if a reflowing step is performed at high temperature. Accordingly, such problems as pyroelectric charges of the surface acoustic wave device that cause other components to break down can be prevented.

While the surface acoustic wave device of the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A surface acoustic wave device comprising:
 a surface acoustic wave element arranged on a piezoelectric substrate, the surface acoustic wave element including at least an excitation electrode and a pad connected to the excitation electrode;
 a package including an external electrode exposed to the outside of the package, the package housing the surface acoustic wave element with the external electrode electrically connected to the pad; and
 a cap covering the surface acoustic wave element and a sealing material sealing the space between the package and the cap; wherein
 the piezoelectric substrate has a specific resistance in the range of about $1.0 \times 10^7$ $\Omega \cdot$cm to about $1.0 \times 10^{13}$ $\Omega \cdot$cm, and the sealing material has a melting point of about 300° C. or less to prevent a pyroelectric effect of the piezoelectric substrate from being restored.

2. The surface acoustic wave device according to claim 1, wherein a region where the external electrode is electrically connected to the pad includes a solder having a melting point of about 300° C. or less.

3. The surface acoustic wave device according to claim 2, wherein at least one of the sealing material and the solder comprises AgSn or an AuSn alloy.

4. The surface acoustic wave device according to claim 1, wherein the piezoelectric substrate comprises $LiTaO_3$ or $LiNbO_3$.

5. A surface acoustic wave device comprising:
 a surface acoustic wave element arranged on a piezoelectric substrate, the surface acoustic wave element including at least an excitation electrode and a pad connected to the excitation electrode;
 a package including an external electrode exposed to the outside of the package, the package housing the surface acoustic wave element with the external electrode electrically connected to the pad;
 a cap covering the surface acoustic wave element and a sealing material sealing the space between the package and the cap; and
 an inert gas sealed within an area between the cap and the package by the sealing material to define an inert gas atmosphere within said area between the cap and the package; wherein
 the piezoelectric substrate has a specific resistance in the range of about $1.0 \times 10^7$ $\Omega \cdot$cm to about $1.0 \times 10^{13}$ $\Omega \cdot$cm, and the surface acoustic wave element housed in the surface acoustic wave device is housed within the inert gas atmosphere; and
 the sealing material has a melting point of about 300° C. or less to prevent a pyroelectric effect of the piezoelectric substrate from being restored.

6. The surface acoustic wave device according to claim 5, wherein the sealing material comprises AgSn or an AuSn alloy.

7. The surface acoustic wave device according to claim 5, wherein the piezoelectric substrate comprises $LiTaO_3$ or $LiNbO_3$.

8. A method for manufacturing a surface acoustic wave device comprising the steps of:
 providing a surface acoustic wave element having on a piezoelectric substrate at least an excitation electrode and a pad connected to the excitation electrode, a package housing the surface acoustic wave element and having an external electrode exposed to the outside of the package;
 electrically connecting the external electrode to the pad; and
 sealing the package with a cap; wherein
 the piezoelectric substrate has a specific resistance in the range of about $1.0 \times 10^7$ $\Omega \cdot$cm to about $1.0 \times 10^{13}$ $\Omega \cdot$cm, and the step of electrically connecting the external electrode to the pad or the step of sealing the package with the cap is performed in an atmosphere of an inert gas and includes heating at a temperature of about 300° C. or less to prevent a pyroelectric effect of the piezoelectric substrate from being restored.

9. The method for manufacturing a surface acoustic wave device according to claim 8, wherein the inert gas comprises $N_2$.

10. The method for manufacturing a surface acoustic wave device according to claim 8, wherein the pad and the external electrode are connected to each other by ultrasonic vibration and Au bump bonding with heating at a temperature of about 300° C. or less.

11. The method for manufacturing a surface acoustic wave device according to claim 8, wherein the pad and the external electrode are connected to each other by a bonding wire.

12. A method for manufacturing a surface acoustic wave device comprising the steps of:
   providing a surface acoustic wave element having on a piezoelectric substrate at least an excitation electrode and a pad connected to the excitation electrode, a package housing the surface acoustic wave element and having an external electrode exposed to the outside of the package;
   electrically connecting the external electrode to the pad; and
   sealing the package with a cap; wherein
   the piezoelectric substrate has a specific resistance in the range of about $1.0 \times 10^7$ Ω·cm to about $1.0 \times 10^{13}$ Ω·cm, and the step of sealing the package includes heating at a temperature of about 300° C. or less to prevent a pyroelectric effect of the piezoelectric substrate from being restored.

13. The method for manufacturing a surface acoustic wave device according to claim 12, wherein the step of electrically connecting the external electrode to the pad includes soldering at a temperature of about 300° C. or less.

14. The method for manufacturing a surface acoustic wave device according to claim 13, wherein the sealing step includes using a sealing material, and wherein at least one of the sealing material and the solder comprises AgSn or an AuSn alloy.

15. The method for manufacturing a surface acoustic wave device according to claim 12, wherein the piezoelectric substrate comprises $LiTaO_3$ or $LiNbO_3$.

* * * * *